United States Patent [19]

Kato

[11] Patent Number: 4,669,176
[45] Date of Patent: Jun. 2, 1987

[54] METHOD FOR DIFFUSING A SEMICONDUCTOR SUBSTRATE THROUGH A METAL SILICIDE LAYER BY RAPID HEATING

[75] Inventor: Juri Kato, Suwa, Japan

[73] Assignee: Seiko Epson Kabushiki Kaisha, Tokyo, Japan

[21] Appl. No.: 756,895

[22] Filed: Jul. 19, 1985

[30] Foreign Application Priority Data

Jul. 30, 1984 [JP]  Japan .................................. 59-160404
Sep. 13, 1984 [JP]  Japan .................................. 59-192301

[51] Int. Cl.⁴ .......................................... H01L 21/385
[52] U.S. Cl. .................................. 29/571; 29/576 R; 29/591; 148/187; 148/188
[58] Field of Search ................... 148/188, 187; 29/591, 29/571, 576 R

[56] References Cited

U.S. PATENT DOCUMENTS 3,690,968  9/1972  Fa et al. ................................ 148/188
4,505,027  3/1985  Schwabe et al. ................. 148/1.5 X
4,558,507  12/1985  Okabayashi et al. ............ 148/1.5 X
4,563,805  1/1986  Scovell et al. .................. 148/188 X

OTHER PUBLICATIONS

"Rapid Annealing Using Halogen Lamps", J. Kato and S. Iwamatsu, Journal of the Electro-Chemical Society, vol. 131, pp. 1145–1152, May, 1984.
"Application of Halogen Lamp Annealing for CMOS VLSI Processing", S. Iwamatsu et al., Abstract No. 216, presented at Detroit, Michigan, Meeting, Oct. 1982.

Primary Examiner—George T. Ozaki
Attorney, Agent, or Firm—Blum Kaplan

[57] ABSTRACT

A method for forming a diffused region on a semiconductor substrate is provided. A silicide layer is formed in a region of a substrate where a diffused layer is to be formed and a material containing an impurity to be defined into the substrate deposited on the silicide layer. The device is heat treated to cause the impurity to diffuse through the silicide layer into the substrate. The method may be used to produce a MOSFET.

41 Claims, 11 Drawing Figures

METHOD FOR DIFFUSING A SEMICONDUCTOR SUBSTRATE THROUGH A METAL SILICIDE LAYER BY RAPID HEATING

BACKGROUND OF THE INVENTION

The present invention is generally directed to a method for producing a semiconductor device and in particular to a method for producing a semiconductor device having a silicon substrate with a diffusion layer containing a diffused impurity or dopant therein.

One conventional technique for producing semiconductor devices utilizes the gaseous diffusion of impurities into selected regions of a semiconductor substrate. This technique requires handling potentially hazardous gasses at high temperatures.

Another common technique for forming a diffused layer having N-type impurities, in a semiconductor device is disclosed by J. Kato and S. Iwamatsu in the Journal of the Electrochemical Society, V. 131, pp. 1145-1152 (1984). In the method disclosed therein, impurity ions are injected into the silicon substrate by means of an ion injection machine. The semiconductor device is then annealed for a short time by using a halogen lamp, thereby forming shallow diffused layers of the impurity.

The conventional methods, including the ion injection method noted above, have several major disadvantages. First, the cost of the gaseous diffusion machines and ion injection machine is quite high. Further, these apparatuses have a complex structure and require considerable maintenance. Further, the rate of diffusion is low, thereby increasing the cost for forming the diffused layers.

Another major disadvantage of the ion injection technique is that when the junction of the diffused layer and the semiconductor substrate is shallow, the resistance of the resulting impurity layer is high. For example, the sheet resistance of a phosphorus diffusion layer having a depth of not more than 0.2 $\mu$m is greater than 50 ohms/□. If the source and drain of a metal oxide semiconductor field effect transistor (hereinafter a "MOSFET") is formed of a material of this resistance, the switching speed of the transistor is limited thereby, thus preventing devices manufactured using Large Scale Integration (hereinafter "LSI") from operating at high speeds.

Another disadvantage of the ion injection method is that it damages the silicon crystal approximately 500 Å deeper than the diffusion layer. Thus, even if annealing is performed on the device for only a short period of time, accelerated diffusion occurs due to recovery of crystal defects. The resulting junction layer is therefore more than 500 Å deep. Thus, the defects produced in the silicon crystal caused by ion injection limit the possible reduction in size of LSI devices.

Yet another disadvantage of the ion injection method is that the placement of contact holes for connecting metal conductors to the diffused impurity layer is particularly critical. If the contact hole is not placed precisely on the diffused layer, or is on a peripheral portion of the diffused layer, there is an electrical path between the electrical conductor and the substrate which causes leakage currents. Thus, it is necessary to provide large tolerances on the position of the contact holes and the diffused layers to assure proper registry. This also serves to limit density and LSI miniaturization.

Thus, as noted above the conventional method for forming diffused layers is relatively costly, slow and not conducive to high density integration required in LSI and VLSI.

Accordingly, there is a need for a method for producing a semiconductor device having an impurity layer containing a diffused impurity which is low in cost, does not require a long operation time and does not hinder high density integration.

SUMMARY OF THE INVENTION

Generally speaking, in accordance with the invention, a method for forming a diffusion layer containing a diffused impurity in a silicon substrate of a semiconductor device and for forming a contact hole for connecting a metal conductor formed on the device to the diffusion layer is provided.

The basic method for producing the semiconductor device includes the step of forming a silicide layer in a region of the device where the diffused layer is to be formed. A compound containing the impurity is then applied to the silicide layer. The device is then baked at a low temperature. The device is then heat treated to cause the impurity to diffuse through the silicide layer and into the substrate. The method may be used to produce a MOSFET.

When the silicon substrate includes a first diffusion layer and an insulator film thereon, a contact hole for connecting a metal conductor deposited on the device to the diffusion layer is produced according to the invention by first forming a contact hole extending to the diffusion layer through the insulator film. A contact layer formed from either a metal or a silicide is then formed on the insulator film and a portion thereof fills the contact hole to contact the diffusion layer. A compound containing the impurity is then applied to the contact layer. The device is then baked at a low temperature and heat treated to cause the impurity to diffuse through the contact layer and into the substrate. A semiconductor device having a second diffusion layer in the substrate immediately adjacent the region of contact between the portion of the contact layer which fills the contact hole and the substrate is thus formed. This second diffusion layer at least partially overlaps the first diffusion layer.

Accordingly, it is an object of the invention to provide an improved semiconductor device.

It is another object of the invention to provide an improved method for forming an impurity layer in a semiconductor device containing a diffused impurity and having a low sheet resistivity, and a shallow junction at low cost.

It is a further object of the invention to provide an improved method for forming a semiconductor device which can be used to produce semiconductors at low cost which are capable of high speed operation and high density integration as required for LSI and VLSI.

It is a further object of the invention to provide a contact hole for connecting a metal conductor deposited on a semiconductor device with a diffusion layer having a diffused impurity which is self-registerable and formed through the silicide layer.

Still other objects and advantages of the invention will in part be obvious and will in part be apparent from the specification.

The invention accordingly comprises the several stops and the relation of one or more of such steps with respect to each of the others, and the articles possessing the features, properties and the relation of elements, which are exemplified in the following detailed disclosure and the scope of the invention will be indicated in the claims.

BRIEF DESCRIPTION OF THE DRAWINGS

For a fuller understanding of the invention reference is had to the following description taken in connection with the accompanying drawings, in which.

DETAILED DESCRIPTION OF THE PREFERRED EMBODIMENTS

The present invention is directed to a method for forming a diffusion layer containing a diffused impurity in a silicon substrate of a semiconductor device. The present invention is also directed to a method for producing a semiconductor device having a diffusion layer, an insulator film and a contact hole for connecting a metal conductor deposited on the device to the diffusion layer. In addition, the present invention is directed to devices produced according to each method.

Figure 1:
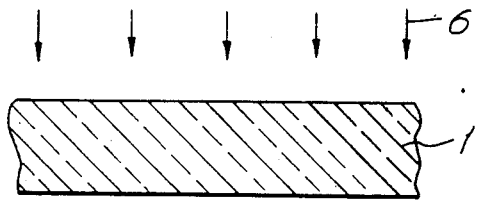
FIG. 1 and FIG. 2 are cross sectional views illustrating a conventional ion injection method for forming a semiconductor device.
Figure 2:
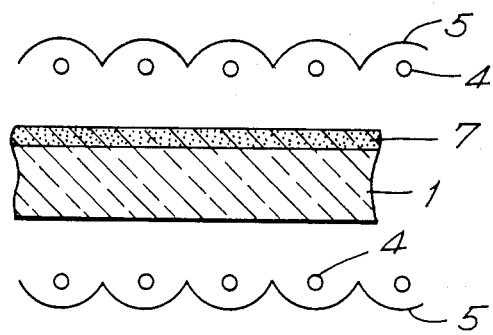

Reference is made to FIG. 1 where in accordance with a conventional ion injection method ions 6 of phosphorus ($^{31}p^+$) are injected into a silicon substrate 1 by using an ion injecting machine (not shown). Heat treatment is effected by halogen lamps 4 and mirrors 5 (FIG. 2) for forming an N-type diffusion junction layer 7. This conventional process is expensive and due to the complexity of the ion injecting machine and the time required to load and unload the machine, the process is quite time consuming resulting in low yield per unit time and therefore high costs. In addition, the solid solubility limit of phosphorus in silicon limits the conductivity of the N-type diffusion layer. Thus, when the junction is shallow, the sheet resistivity is high.

Further, as noted above, the process of ion injection creates defects in the crystal of the silicon substrate. This disruption or destruction of the silicon crystal caused by the ion injection extends more than 500 Å deeper than the diffused layer of phosphorus impurity. The recovery of crystal defects which accompanies heat treatment thus causes accelerated diffusion of phosphorus impurity preventing the formation of a shallow junction having a thickness of 500 Å or less.

The three factors discussed above are the major factors which prevent reduction in cost, and inhibit speed in the production process and high density integration of VLSI devices.

Figure 3:
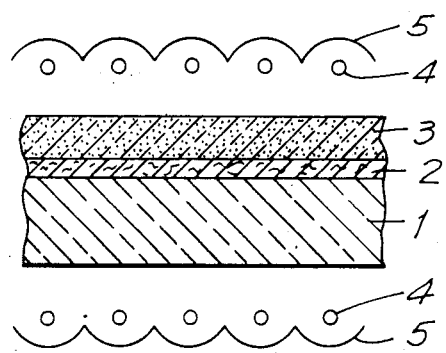
FIG. 3 and FIG. 4 are cross sectional views illustrating the method for forming a semiconductor device in accordance with a first embodiment of the invention.

FIG. 3 ilustrates in cross-section a semiconductor device being manufactured in accordance with the process of the invention. A silicide film 2 is formed on a silicon substrate 1 of a monocrystalline or polycrystalline structure. Silicide layer 2 may be a silicide formed with titanium, tungsten, molybdenum or tantalum and has a high melting point. These metals may be used to form the silicide layers in all embodiments of the invention disclosed herein. Silicide layer 2 may be formed by sputtering the metal on silicon substrate 1 and then annealing the device. The conductivity of metal silicide layer 2 formed on silicon substrate 1 is of significance in determining the sheet resistivity of the material. For example, a titanium silicide layer of approximately 500 Å has a low sheet resistivity of about 10 ohms/□.

A layer 3 containing an impurity or dopant to be diffused into substrate 1 is formed on silicide layer 2. This layer may include for example, a phosphorus impurity if an N-type diffusion layer is to be formed or a boron impurity if a p-type diffusion layer is to be formed. It will be understood that this applies to all embodiments of the invention disclosed herein. If an N-type impurity layer is to be formed, a glass including an impurity such as phosphorus can be used to coat the silicide layer. This glass may be applied by a spin coater and is then referred to as Spin-On-Phosphosilicate-Glass (hereinafter "SOPSG").

After the impurity compound layer 3 is applied to silicide layer 2, preferably by spin coating, the semiconductor device is baked at a temperature of 500° C. or lower. Then, as shown in FIG. 3, the semiconductor device is heat treated with halogen lamps 4 at a temperature of 900° C. or higher for a short period of time. Heat treatment is preferably performed in an atmosphere of relatively inactive gas such as nitrogen. Mirrors 5 are designed so that light from halogen lamps 4 is uniformly applied to silicon substrate 1. The use of a spin coater and halogen lamps 4, which are inexpensive and simple devices, greatly reduce the manufacturing cost of devices utilizing LSI or VLSI.

Figure 4:
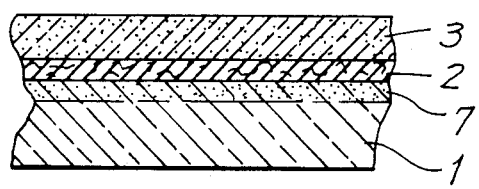

If halogen lamp heat treatment is performed at 1,000° C. for 6 seconds when impurity layer 3 of SOPSG is formed on silicide layer 2, phosphorous from the SOPSG diffusion source may pass through a silicide layer as thick as 1,000 Å, forming a diffused layer of phosphorus in substrate 1 having a thickness of approximately 300 Å beneath silicide layer 2. Since heat treatment is preformed for only a short period of time, preferably between about 1 and 100 seconds, it is possible to form a diffusion layer 7 (FIG. 4) beneath silicide layer 2 to a depth of less than 500 Å, thus producing a shallow junction.

Reference is made to FIGS. 5 through 8 which are cross sectional views of a semiconductor device showing the manufacturing steps of the present invention used for forming the source, drain and gate regions of a MOSFET.

Figure 5:
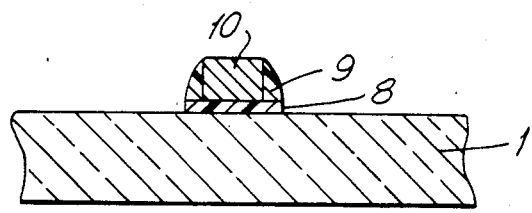
FIG. 5 through FIG. 8 are cross sectional views illustrating the method of forming a MOSFET in accordance with the invention.

FIG. 5 shows a gate-oxide film 8, a polycrystalline silicon gate electrode 10 and a side insulator layer 9 of silicon dioxide formed on silicon substrate 1.

Figure 6:
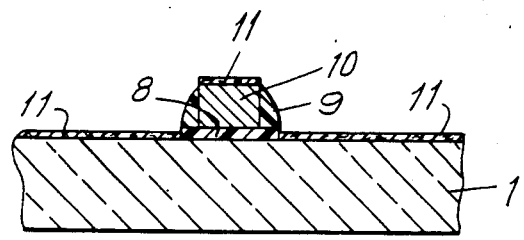

FIG. 6 shows silicide layer 11, having a high melting point, selectively formed on the gate electrode, the source and the drain regions of the MOSFET.

Figure 7:
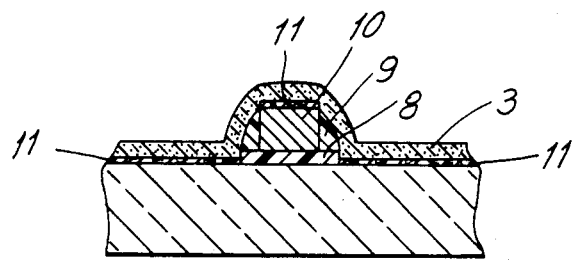
Figure 8:
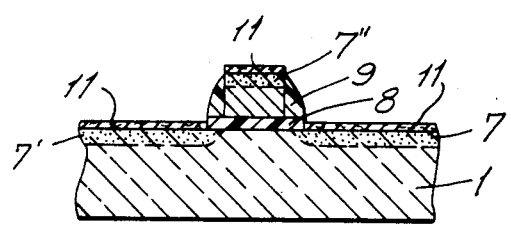

A coating 3 of SOPSG is applied to the semiconductor device by a spin coater to form the arrangement illustrated in FIG. 7. After the substrate is baked at a temperature of 500° C. or lower, heat treatment is performed at a temperature of 900° C. or higher for a short period of time by exposing the device to the output of a halogen lamp. As illustrated in FIG. 8 a MOSFET having a shallow N-type diffused layer is obtained.

In FIG. 8, silicide layer 11, having a low sheet resistivity, covers the shallow phosphorus diffused junction layer 7 of the source region and junction layer 7' of the drain region. In addition, silicide layer 11 is also formed on the surface of gate electrode 10 and a diffusion layer 7'' is formed during heat treatment. Since the junctions are shallow, the total volume of the junctions is small, thus providing a MOSFET having high switching speed and small size. Further the sheet resistivity of each of the regions of the source, gate and drain is reduced, which also tends to increase the switching speed.

Figure 9:
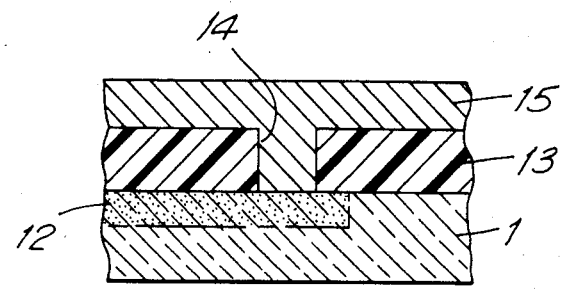
FIG. 9 is a cross sectional view illustrating the steps in a conventional method for forming a contact hole for connecting a metal conductor and a diffused layer.

FIG. 9 is a cross sectional view of a semiconductor device in which a contact hole 14 for connecting a metal conductor 15 and an N-type diffusion layer 12 is formed in accordance with a conventional method.

In this conventional method, contact hole 14 is formed in an insulating layer 13 on substrate 1. Contact hole 14 must have a relatively large area (for example, a diameter of approximately 1.5 μm) so that contact hole 14 properly registers with diffusion layer 12. Thereafter, a conductive layer 15, of aluminum or aluminum silicide is formed on insulating layer 13 and ions of a material such as arsenic (for forming an N-type layer) are injected into conductive layer 15. Ohmic contact is provided by performing heat treatment as approximately 450° C.

Since it is necessary to utilize a relatively large surface area for defining the relative positions of contact hole 14 and diffusion layer 12, miniaturization of LSI or VLSI devices is not promoted by this conventional method. In addition, when N-type diffusion layer 12 is shallow, a material such as aluminum of conductive layer 15 may pierce N-type diffusion layer 12 when ions of arsenic or the like are injected and the device is heated treated. This cause leakage current between silicon substrate 1 and conductive layer 15. Finally, as the LSI is miniaturized, conductive layer 15 becomes thinner. This causes electromigration when the LSI device is in operation, thereby lowering the reliability of the device. These shortcomings limit miniaturization and reliability of such conventional semiconductor devices.

Figure 10:
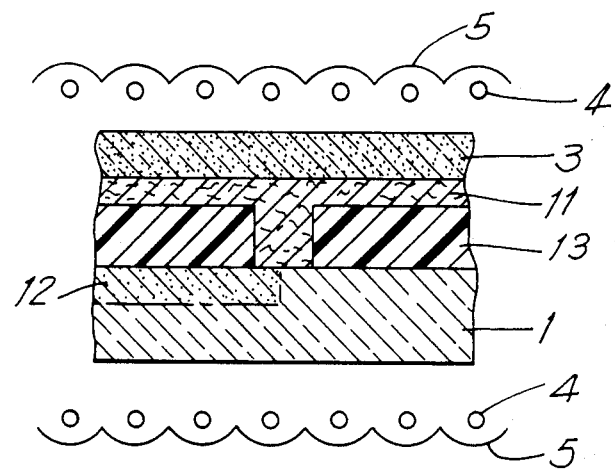
FIG. 10 and FIG. 11 are cross sectional views illustrating the steps in a method in which a shallow diffused layer is formed in a semiconductor substrate in a region near a contact hole, in accordance with the invention.
Figure 11:
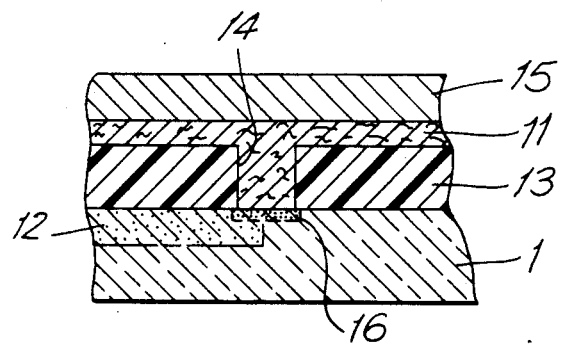

Referring to FIGS. 10 and 11, according to the present invention insulating layer 13 of, for example, silicon dioxide is formed by a conventional method on silicon substrate 1 in which an N-type diffusion layer 12 has been formed. A contact hole 14 is formed in insulating layer 13 for connecting metal conductive layer 15 (which is formed later) and N-type diffusion layer 12. Then, a metal or metal silicide contact layer 11 having a high melting point is formed on insulating layer 13 and fills contact hole 14. Next, the device is coated with SOPSG impurity layer 3 by a spin coater. After baking at a temperature 500° C. or lower, heat treatment is performed at a temperature of 900° C. or higher for a short time by irradiating the device with the output of halogen lamps 4 reflected by mirrors 5 to form a shallow phosphorus diffusion layer 16 within or beneath contact hole 14.

In accordance with the present invention, even if a part of contact hole 14 is outside N-type diffused region or layer 12 as illustrated in FIG. 10, there is no current leakage. Shallow phosphorus diffusion layer 16 is self-registerably formed through the metal or silicide contact layer 11, as a result of diffusion from the diffusion source of SOPSG impurity layer 3. Thus, there is no current leakage from the conductive layer 15 and the metal or silicide contact layer 11 into silicon substrate 1.

It is necessary that there be only some overlap or common region of first diffusion layer 12 and diffusion layer 16. Thus, in accordance with this invention, it is not necessary to utilize extra surface area for completely aligning contact hole 14 with N-type diffusion layer 12.

After diffusion layer 16 is formed, SOPSG impurity layer 3 is removed. Then, conductive layer 15 is formed on contact layer 11. Since contact layer 11 is formed of a material having a high melting point, it has excellent anti-electromigration properties, and a highly reliable connection is achieved. In addition, there is no possibility of conductor 15 piercing diffusion layer 12 to make electrical contact with silicon substrate 1. Finally, by utilizing halogen lamp, high temperature, short term heat treatment, it is possible to form a junction of N-type diffused material having a thickness of only 300 Å. This promotes miniaturization of LSI and VLSI devices.

In accordance with this invention, by forming an impurity layer on the surface of a silicide layer on a silicon substrate, and performing heat treatment over a short period of time using a halogen lamp, a shallow diffusion junction layer of low sheet resistivity is formed at low cost, using simple and inexpensive equipment.

Further, according to the method of the present invention, the mount of surface area needed for defining the position of a contact hole over a diffused layer to assure complete alignment therebetween is greatly reduced. When the method of the present invention is applied to manufacturing MOSFET, VLSI devices of low cost, high density and improved reliability are attained.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method of forming a region of impurities diffused into a silicon substrate of a semiconductor device comprising:
   providing a silicon substrate;
   forming a silicide layer on the surface of the substrate in at least a region where the region of impurities is to be formed;
   depositing an impurity layer including the impurity to be diffused onto the silicide layer to form a device; and
   heating the device for a period of less than about 100 seconds at a temperature sufficient to cause the impurities from the impurity layer on the silicide layer to be diffused through the silicide layer into the surface of the substrate for forming a shallow diffused region in the silicon substrate.

2. The method of claim 1, wherein said impurity is selected from the group consisting of phosphorus and boron.

3. The method of claim 1, wherein said step of depositing the impurity layer onto said silicide layer comprises coating said silicide layer with a phosphosilicate glass containing the impurity.

4. The method of claim 3, wherein said step of depositing the impurity layer onto said silicide layer comprises spin coating.

5. The method of claim 1, wherein said step of heating comprises exposing said device to a halogen lamp.

6. The method of claim 1, wherein said step of heating is performed at a temperature of greater than about 900° C. for a period of between about one and 100 seconds.

7. The method of claim 1, wherein said step of heating is performed in an atmosphere of inactive gas.

8. The method of claim 7, wherein the inactive gas is nitrogen or an inert gas.

9. The method of claim 1, further comprising baking the device at a temperature of less than 500° C. after depositing the impurity layer onto the silicide layer.

10. The method of claim 1, wherein said silicide layer is comprised of a high melting point silicide.

11. The method of claim 10, wherein said silicide is selected from the group consisting of titanium silicide, tungsten silicide, molybdenum silicide and tantalum silicide.

12. The method of claim 1, wherein said diffused region has a thickness of less than about 300 Å.

13. The method of claim 1, wherein said silicide layer is formed by applying a metal layer on said substrate and annealing the substrate and metal layer to form said silicide layer.

14. The method of claim 13, wherein said annealing occurs during said step of heating said device to cause said silicide layer to be formed and said impurities to be diffused through the silicide layer being formed.

15. A method for forming a semiconductor device comprising:
providing a silicon substrate;
forming a first diffusion layer on said silicon substrate;
providing an insulating layer on said first diffusion layer;
forming a contact hole through said insulating layer, to extend to said first diffusion layer;
forming a contact layer comprised of one of a metal or a silicide on said insulating layer and through said contact hole to contact said first diffusion layer;
depositing an impurity layer including an impurity onto said contact layer to yield a device; and
heating said device for a period of less than about 100 seconds at a temperature sufficient to cause said impurity to diffuse through said contact layer and into said substrate to form a second diffusion layer adjacent to the contact hole.

16. The method of claim 15, wherein said impurity is one of phosphorus and boron.

17. The method of claim 15, wherein said step of depositing onto said contact layer comprises coating said contact layer with a phosphosilicate glass.

18. The method of claim 17, wherein the step of depositing onto said contact layer comprises spin coating.

19. The method of claim 15, wherein said step of heating comprises exposing said device to a halogen lamp.

20. The method of claim 15, wherein said step of heating is performed at a temperature of greater than about 900° C. for a period of between about one and 100 seconds.

21. The method of claim 15, wherein said step of heating is performed in an atmosphere of inactive gas.

22. The method of claim 21, wherein the inactive gas is nitrogen or an inert gas.

23. The method of claim 15, further comprising baking at a temperature of less than about 500° C. after depositing the impurity layer onto the silicide layer.

24. The method of claim 15, wherein said silicide layer is comprised of a high melting point silicide.

25. The method of claim 24, wherein said silicide is selected from the group consisting of titanium silicide, tungsten silicide, molybdenum silicide and tantalum silicide.

26. The method of claim 15, wherein said second diffusion layer has a thickness less than that of said first diffusion layer.

27. The method of claim 15, wherein said contact layer is a metal and said metal is applied by sputtering.

28. A method for forming a semiconductor device on a silicon semiconductor substrate having diffused regions doped with impurities beneath the surface of the substrate, comprising:
providing a silicon substrate;
forming a gate insulating film on the substrate;
providing a gate electrode on the gate insulating film;
forming a silicide layer on the gate electrode;
depositing an impurity layer including an impurity to be diffused on the silicide layer to yield a device; and
heat treating the device for a period of less than about 100 seconds at a temperature sufficient to cause the impurity to be diffused through the silicide layer into the substrate in regions adjacent the gate for forming source and drain regions of the device.

29. The method of claim 28, wherein said gate insulating film is silicon dioxide.

30. The method of claim 28, wherein said impurity is one of phosphorus and boron.

31. The method of claim 28, wherein said step of depositing an impurity layer on said silicide layer comprises coating said silicide layer with a phosphosilicate glass.

32. The method of claim 31, wherein said step of depositing the impurity layer onto said silicide layer comprises spin coating.

33. The method of claim 28, wherein said step of heat treating comprises exposing said device to a halogen lamp.

34. The method of claim 28 wherein said step of heat treating is performed at a temperature of greater than about 900° C. for a period of between about one and 100 seconds.

35. The method of claim 28, wherein said step of heattreating is performed in an atmosphere of inactive gas.

36. The method of claim 35, wherein the inactive gas is nitrogen or an inert gas.

37. The method of claim 28, further comprising the step of baking the device at a temperature of less than 500° C. prior to heat treating the device.

38. The method of claim 28, wherein said silicide layer is comprised of a high melting point silicide.

39. The method of claim 38, wherein said silicide layer is selected from the group consisting of titanium silicide, tungsten silicide, molybdenum silicide and tantalum silicide.

40. The method of claim 28, wherein said source and drain regions have thicknesses of less than about 300 Å.

41. The method of claim 28, wherein said silicide layer is formed by applying a metal layer on said substrate and annealing said substrate and metal layer to form said silicide layer.

* * * * *